(12) United States Patent
Botula et al.

(10) Patent No.: US 7,477,497 B2
(45) Date of Patent: Jan. 13, 2009

(54) APPARATUS FOR ELECTROSTATIC DISCHARGE PROTECTION OF BIPOLAR EMITTER FOLLOWER CIRCUITS

(75) Inventors: Alan B. Botula, Essex Junction, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 247 days.

(21) Appl. No.: 11/426,619

(22) Filed: Jun. 27, 2006

(65) Prior Publication Data

US 2007/0297107 A1 Dec. 27, 2007

(51) Int. Cl.
*H02H 9/00* (2006.01)
(52) U.S. Cl. ...................................................... 361/56
(58) Field of Classification Search .................... 361/56
See application file for complete search history.

(56) References Cited

U.S. PATENT DOCUMENTS

| | | | |
|---|---|---|---|
| 6,333,642 B1 | 12/2001 | Kurisu | |
| 6,399,990 B1 | 6/2002 | Brennan et al. | |
| 6,703,870 B2 * | 3/2004 | Chung et al. | 327/51 |
| 7,102,862 B1 * | 9/2006 | Lien et al. | 361/56 |
| 7,242,559 B2 * | 7/2007 | An | 361/56 |
| 2005/0063111 A1 * | 3/2005 | Wang | 361/56 |
| 2005/0264964 A1 * | 12/2005 | Coronel et al. | 361/56 |
| 2007/0076338 A1 * | 4/2007 | Traynor et al. | 361/56 |

* cited by examiner

*Primary Examiner*—Michael J Sherry
*Assistant Examiner*—Christopher J Clark
(74) *Attorney, Agent, or Firm*—Cantor Colburn LLP; W. Riyon Harding

(57) ABSTRACT

An ESD bypass device for an emitter follower circuit includes a discharge device in parallel with the emitter follower circuit and control circuitry associated with the discharge device. The control circuitry is configured to prevent bypass current conduction through the discharge device in a normal mode of operation, and is configured to cause the discharge device to conduct bypass current during an ESD event. The control circuitry further includes a first transistor configured to pass input current to the discharge device for activating the discharge device during the ESD event, the first transistor further configured to prevent input current passing therethrough during the normal mode. A second transistor is configured to shunt leakage current, associated with the first transistor, from the input of the discharge device. The second transistor is further configured to prevent shunting of input current from the first transistor to the discharge device during the ESD event.

6 Claims, 3 Drawing Sheets

APPARATUS FOR ELECTROSTATIC DISCHARGE PROTECTION OF BIPOLAR EMITTER FOLLOWER CIRCUITS

BACKGROUND

The present invention relates generally to electrostatic discharge (ESD) in integrated circuits and, more particularly, to an ESD bypass device for protecting bipolar emitter follower circuits.

Electrostatic Discharge (ESD) events, which can occur both during and after manufacturing of an integrated circuit (IC), can cause substantial damage to the IC. In particular, there are three general types of ESD events that have been modeled: the human body model (HBM), the machine model (MM) and the charged device model (CDM). The HBM and MM represent discharge current between any two pins on an IC as a result of (respectively) a human body discharging through a chip and a metal tool discharging through a chip. Whereas a human body discharge is relatively slow in terms of rise time and has a unidirectional current in the range of about 1-3 amps, a tool discharge is a relatively rapid event that produces an even higher, bi-directional current into and out of the pin (e.g., about 3-5 amps). In the CDM, the ESD event does not originate from outside the IC device itself, but instead represents the discharge of an IC device to ground. The IC device is charged through the triboelectric effect (frictional charging) or by an external field. The charging of the device substrate itself does not subject the IC to ESD damage, but rather the discharging. As is the case with the MM, the CDM is a very rapid event.

Because of this potential damage, on-chip ESD protection or bypass circuits for IC chips have become commonplace. In general, such protection circuits are characterized by a high failure threshold, a small layout size and a low resistive/capacitive (RC) delay so as to allow high-speed applications. An ESD event within an IC can be caused by a static discharge occurring at one of the power lines or rails. An effective ESD bypass device should maintain the voltage at the power line to a value that is known to be acceptable for the operating circuits, and that will not interfere with the operating circuits under normal operating conditions.

An ESD bypass device circuit is typically constructed between a positive power supply rail (e.g., $V_{DD}$) and a ground plane, a ground plane and a negative power supply rail (e.g., $V_{SS}$), or a supply rail and an external connection to the chip. The primary purpose of the ESD clamp is to reduce the impedance between the rails so as to reduce the impedance between the input pad and the rail, and to protect the power rails themselves from ESD events. In particular, bipolar emitter follower amplifiers present a difficult ESD protection challenge because they are biased into forward active operation during a negative ESD discharge when the reference pin is the power supply. To protect these circuits, it is therefore desirable to implement a bypass device that will conduct current in parallel with the emitter follower device during an ESD discharge, but does not conduct current in normal circuit operation.

SUMMARY

The foregoing discussed drawbacks and deficiencies of the prior art are overcome or alleviated by an ESD bypass device for an emitter follower circuit. In an exemplary embodiment, the bypass device includes a discharge device connected in parallel with the emitter follower circuit and control circuitry associated with the discharge device, the control circuitry configured to prevent bypass current conduction through the discharge device in a normal mode of operation in which power is connected to the emitter follower circuit, and configured to cause the discharge device to conduct bypass current during an ESD event. The control circuitry further includes a first transistor configured to pass input current to the discharge device for activating the discharge device during the ESD event, with the first transistor further configured to prevent input current passing therethrough during the normal mode of operation. A second transistor is configured to shunt leakage current, associated with the first transistor in the normal mode of operation, from the input of the discharge device. The second transistor is further configured to prevent shunting of input current from the first transistor to the discharge device during the ESD event.

In another embodiment, an electrostatic discharge (ESD) bypass device for protecting an emitter follower circuit includes a discharge device connected between a voltage supply rail and an external pad connection, the discharge device in parallel with the emitter follower circuit, and control circuitry associated with the discharge device. The control circuitry is configured to prevent bypass current conduction through the discharge device in a normal mode of operation in which power is connected to the voltage supply rail, and configured to cause the discharge device to conduct bypass current during an ESD event. The control circuitry further includes a first transistor configured to pass input current to the discharge device for activating the discharge device during the ESD event, and the first transistor is further configured to prevent input current passing therethrough during the normal mode of operation. A second transistor is configured to shunt leakage current, associated with the first transistor in the normal mode of operation, from the input of the discharge device, and is further configured to prevent shunting of input current from the first transistor to the discharge device during the ESD event.

TECHNICAL EFFECTS

As a result of the summarized invention, a solution is technically achieved in which a bypass device conducts discharge current in parallel with an emitter follower device during an ESD discharge, but does not conduct discharge current in normal mode of circuit operation.

BRIEF DESCRIPTION OF THE DRAWINGS

Referring to the exemplary drawings wherein like elements are numbered alike in the several Figures.

DETAILED DESCRIPTION

Figure 1:
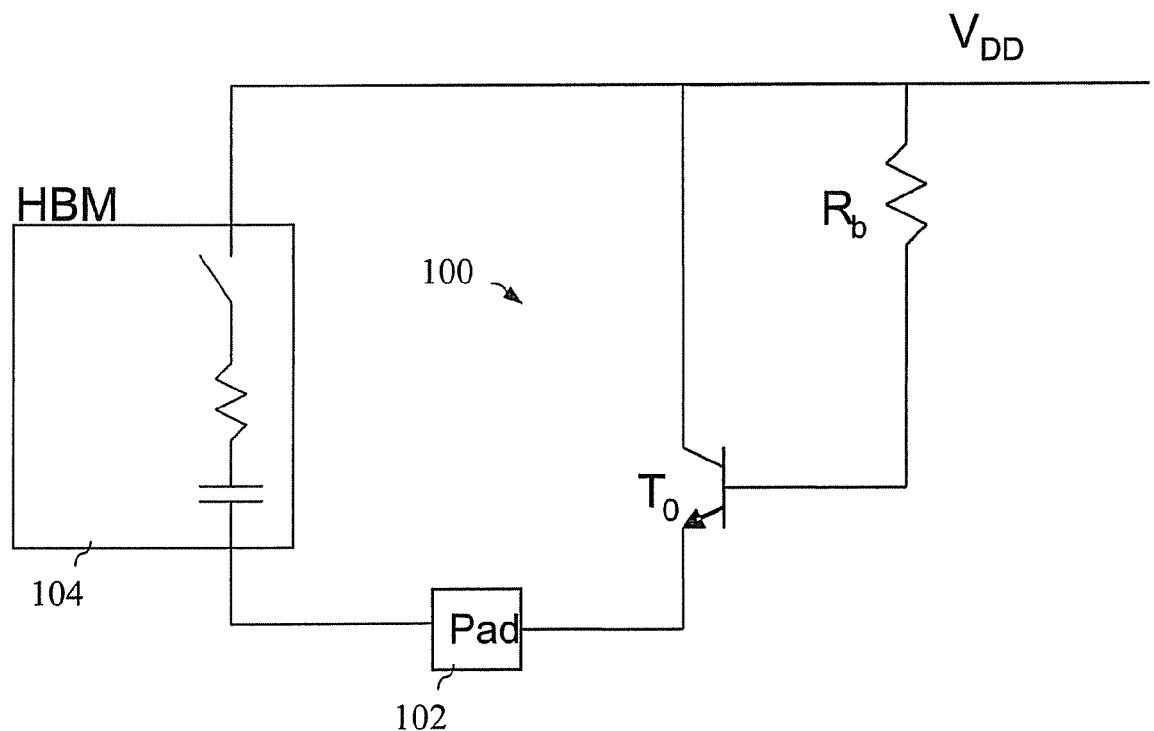
FIG. 1 is a schematic diagram of a circuit including an emitter follower amplifier stage that is susceptible to an ESD event.

Referring initially to FIG. 1, a schematic diagram of a circuit including an emitter follower amplifier stage 100 is illustrated. In particular, the emitter follower amplifier stage 100 includes a bipolar transistor $T_0$ having a collector terminal coupled to a voltage supply rail ($V_{DD}$) and a base terminal coupled to $V_{DD}$ through a base resistor $R_b$. An emitter terminal of $T_0$ is connected to an external pad 102, which is susceptible to an ESD event such as an HBM discharge between the external pad 102 and the supply rail. Block 104 shown in FIG. 1 schematically models a capacitive discharge applied across the external pad 102 and the supply rail $V_{DD}$. As indicated above, the bipolar emitter follower device 100 as shown in FIG. 1 represents a difficult ESD challenge because $T_0$ is biased into forward active operation during an ESD discharge. That is, the reference pad 102 coupled to the emitter of $T_0$ is driven to a negative voltage with respect to ground while the power supply rail coupled to the base of $T_0$ is driven to a positive voltage with respect to ground.

Figure 2:
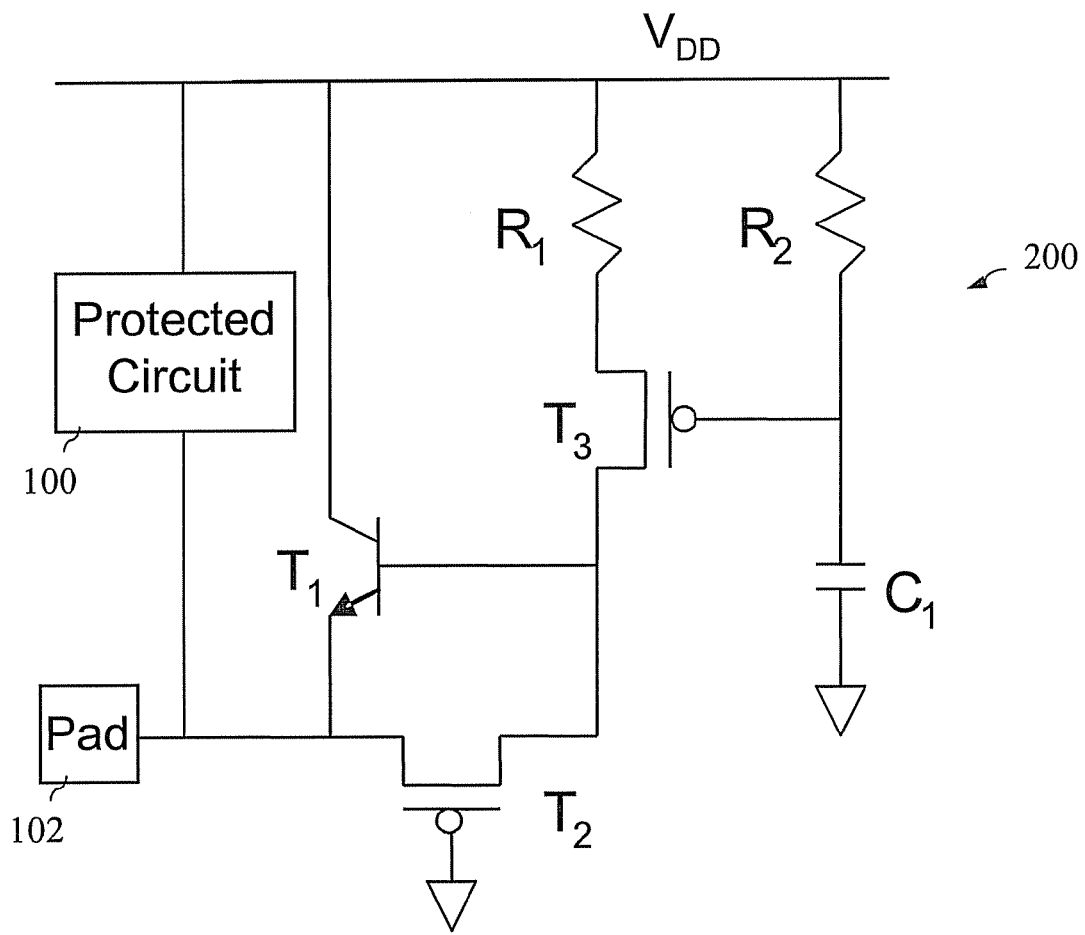
FIG. 2 is a schematic diagram of a bypass circuit configured for ESD protection of a bipolar emitter follower, in accordance with an embodiment of the invention.

Accordingly, in order to protect a circuit such as shown in FIG. 1, a protective ESD bypass device is desired that will, during normal operating conditions (i.e., no ESD events), be transparent to the operation of the circuitry. FIG. 2 is a schematic diagram of a bypass circuit 200, in accordance with an embodiment of the invention. As is shown, bypass circuit 200 includes a bipolar (e.g., n-p-n) transistor $T_1$ for providing ESD discharge current, and control circuitry for discharge device $T_1$, which includes field effect transistors (FETs) $T_2$ and $T_3$, resistors $R_1$ and $R_2$, and capacitor $C_1$. Block 100 represents a circuit to be protected, such as the emitter follower amplifier stage shown in FIG. 1. However, it will be appreciated that bypass circuit 200 may be utilized in conjunction with other types of circuit devices susceptible to ESD damage.

In normal circuit operation (i.e., no ESD discharge event) where the chip is "powered up," capacitor $C_1$ charges to $V_{DD}$ through resistor $R_2$, turning off PFET $T_3$. This prevents substantial current from flowing through $R_1$ to the pad 102. In addition, (grounded gate) FET $T_2$ prevents the n-p-n base voltage from rising above the emitter and amplifying any leakage current through $T_3$. For example, this may be the case where the pad 102 is at ground potential and a leaky $T_3$ would otherwise cause the base of $T_1$ to try and charge toward $V_{DD}$. (However, if the pad 102 is also at $V_{DD}$, then even a leaky $T_3$ would not pass current since the voltage across $T_3$ would be equalized in the first place.) Thus, any leakage current flowing through $T_3$ is prevented from being injected into the base of $T_1$, and instead is shunted through $T_2$ to the pad 102. As a result, no current flows through the discharge device $T_1$ when the circuit is operating normally.

Conversely, during an ESD discharge event, the chip is normally unpowered and thus the gate of $T_3$ is initially at ground potential. A subsequent ESD pulse immediately drives the $V_{DD}$ rail to a higher voltage with respect to both the pad 102 and ground. Since the gate voltage of $T_3$ does not instantaneously change following the negatively spiking voltage of pad 102, $T_3$ is turned on and remains on for the RC time constant determined by $R_2C_1$. This time constant is designed to exceed the pulse length of the ESD event. At the same time, the ESD discharge pulls both the source and drain of $T_2$ negative with respect to ground, thereby turning $T_2$ off and preventing $T_2$ from shunting supply current away from the base of discharge device $T_1$. As a result, $T_1$ can fully operate in forward active mode to carry the discharge and prevent excessive voltage build up across the protected circuit.

Figure 3:
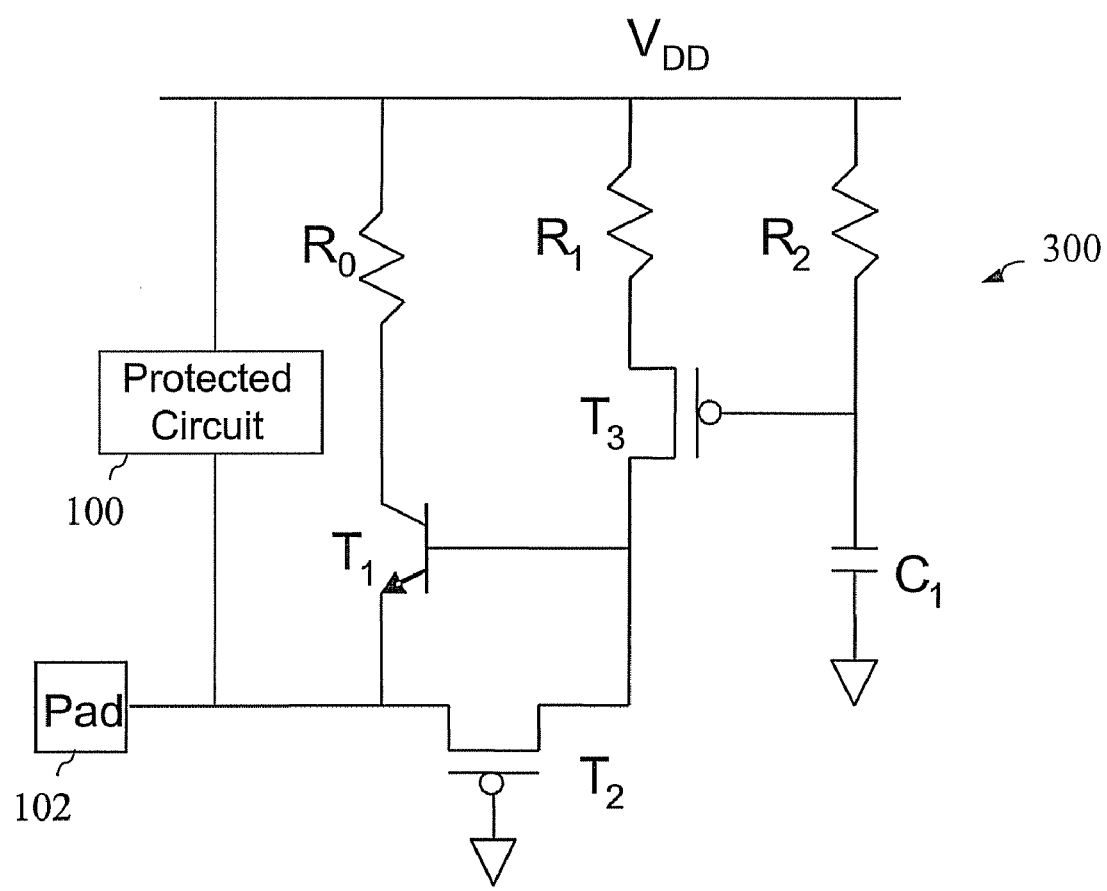
FIG. 3 is a schematic diagram of a bypass circuit configured for ESD protection of a bipolar emitter follower, in accordance with an alternative embodiment of the invention.

FIG. 3 is a schematic diagram of an alternative embodiment 300 of the bypass circuit of FIG. 2. In particular, the bypass network 300 may be made more robust by the addition of $R_0$ in series with $T_1$. The presence of $R_0$ increases ESD tolerance by lowering the energy being dissipated in the discharge n-p-n transistor $T_1$. Finally, it should be appreciated that FET $T_2$ could also be replaced in FIGS. 2 and 3 by a resistor and/or other elements to achieve a similar function (i.e., preventing leakage current through $T_3$ from being amplified by $T_1$ in a normal mode of operation without drawing any current away from the base of $T_1$ during an ESD event). Furthermore, transistor $T_3$ may also be replaced by other elements to achieve the function of turning off the current path to the base of $T_1$ in normal operation and connecting the current path to the base of $T_1$ during an ESD pulse.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An electrostatic discharge (ESD) bypass device for an emitter follower circuit, comprising:

a bipolar transistor discharge device connected in parallel with the emitter follower circuit; and control circuitry associated with the discharge device, the control circuitry configured to prevent bypass current conduction through the discharge device in a normal mode of operation in which power is connected to the emitter follower circuit, and configured to cause the discharge device to conduct bypass current during an ESD event, the control circuitry further comprising:

a first transistor configured to pass input current to the discharge device for activating the discharge device during the ESD event, and the first transistor further configured to prevent input current passing therethrough during the normal mode of operation, wherein the first transistor comprises a PFET having a gate terminal coupled to an RC network included within the control circuitry; and a second transistor configured to shunt leakage current, associated with the first transistor in the normal mode of operation, from the input of the discharge device, and the second transistor farther configured to prevent shunting of input current from the first transistor to the discharge device during the ESD event, wherein the second transistor comprises a grounded-gate PFET connected between the first transistor and an emitter terminal of the discharge device.

2. The ESD bypass device of claim 1, wherein the first transistor is rendered conductive for a time corresponding to an RC time constant of the RC network following the beginning of the ESD event, with the RC time constant selected to exceed a pulse length of the ESD event.

3. The ESD bypass device of claim 1, further comprising a resistor configured in series with the discharge device.

4. An electrostatic discharge (ESD) bypass device for protecting an emitter follower circuit, comprising:

a discharge device connected between a voltage supply rail and an external pad connection, the discharge device in parallel with the emitter follower circuit, wherein the discharge device comprises a bipolar transistor having an emitter terminal connected to the external pad connection and a base terminal connected to the first transistor; and control circuitry associated with the discharge device, the control circuitry configured to prevent bypass current conduction through the discharge device in a normal mode of operation in which power is connected to the voltage supply rail, and configured to cause the discharge device to conduct bypass current during an ESD event, the control circuitry further comprising:

a first transistor configured to pass input current to the discharge device for activating the discharge device during the ESD event, and the first transistor further configured to prevent input current passing therethrough during the normal mode of operation, wherein the first transistor comprises a PFET having a gate terminal coupled to an RC network of the control circuitry, the RC network connected between the voltage supply rail and a ground terminal; and a second transistor configured to shunt leakage current, associated with the first transistor in the normal mode of operation, from the input of the discharge device, and the second transistor farther configured to prevent shunting of input current from the first transistor to the discharge device during the ESD event, wherein the second transistor comprises a grounded-gate PFET connected to the first transistor and across the base and emitter terminals of the discharge device.

5. The ESD bypass device of claim 4, wherein the first transistor is rendered conductive for a time corresponding to an RC time constant of the RC network following the beginning of the ESD event, with the RC time constant selected to exceed a pulse length of the ESD event.

6. The ESD bypass device of claim 4, farther comprising a resistor configured in series with the discharge device.

* * * * *